United States Patent
Simin et al.

(10) Patent No.: US 8,525,226 B2
(45) Date of Patent: Sep. 3, 2013

(54) FIELD EFFECT TRANSISTOR WITH FREQUENCY DEPENDENT GATE-CHANNEL CAPACITANCE

(75) Inventors: Grigory Simin, Columbia, SC (US); Michael Shur, Latham, NY (US); Remigijus Gaska, Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 84 days.

(21) Appl. No.: 12/474,553

(22) Filed: May 29, 2009

(65) Prior Publication Data
US 2009/0294802 A1 Dec. 3, 2009

Related U.S. Application Data

(60) Provisional application No. 61/130,446, filed on May 30, 2008.

(51) Int. Cl.
*H01L 29/66* (2006.01)
*H01L 21/02* (2006.01)

(52) U.S. Cl.
USPC ............ 257/192; 257/200; 257/E21.403; 257/E29.249

(58) Field of Classification Search
USPC ......... 257/103, 183, 196, E29.252, E33.032, 257/189, 192, 194, 200, E29.246, E29.315, 257/E29.249, E33.034, E21.371, E21.387, 257/E21.403, E21.408
See application file for complete search history.

(56) References Cited

U.S. PATENT DOCUMENTS

| | | | |
|---|---|---|---|
| 6,784,101 B1 * | 8/2004 | Yu et al. | 438/666 |
| 7,217,960 B2 * | 5/2007 | Ueno et al. | 257/103 |
| 2002/0014672 A1 * | 2/2002 | Noble et al. | 257/413 |
| 2007/0090439 A1 * | 4/2007 | Ahn et al. | 257/310 |

FOREIGN PATENT DOCUMENTS
JP   2006173294 A * 6/2006

OTHER PUBLICATIONS

Khan ("Insulating gate III-N heterostructure field-effect transistors for high-power microwave and switching applications", This paper appears in: Microwave Theory and Techniques, IEEE Transactions on, Issue Date : Feb. 2003 ).*

Koudymov et al.,"Monolithically Integrated High-Power Broad-Band RF Switch Based on III-N Insulated Gate Transistors", IEEE Microwave and Wireless Components Letters, vol. 14, No. 12, pp. 560-562, Dec. 2004.

Yang et al., "High-Power Operation of III-N MOSHFET RF Switches", IEEE Microwave and Wireless Components Letters, vol. 15, No. 12, pp. 850-852, Dec. 2005.

* cited by examiner

*Primary Examiner* — Matthew Landau
*Assistant Examiner* — Khaja Ahmad
(74) *Attorney, Agent, or Firm* — LaBatt, LLC

(57) ABSTRACT

A field effect transistor having a channel, a gate, and a structure for decreasing a gate-to-channel capacitance of the transistor as an operating frequency of the transistor increases. The structure can comprise, for example, a barrier disposed between the gate and the channel, which has a dielectric permittivity and/or a conductivity that varies with an operating frequency of the transistor. In an embodiment, the barrier comprises a layer of conducting material, such as conducting polymer, conducting semiconductor, conducting semi-metal, amorphous silicon, polycrystalline silicon, and/or the like.

19 Claims, 8 Drawing Sheets

FIELD EFFECT TRANSISTOR WITH FREQUENCY DEPENDENT GATE-CHANNEL CAPACITANCE

REFERENCE TO PRIOR APPLICATIONS

The current application claims the benefit of co-pending U.S. Provisional Application No. 61/130,446, titled "Field-effect transistor with frequency dependent gate-channel capacitance", which was filed on 30 May 2008, and which is hereby incorporated by reference.

TECHNICAL FIELD

The disclosure relates generally to field effect transistors, and more particularly, to a field effect transistor configured for improved operation as a radio-frequency switch.

BACKGROUND ART

Solid state radio frequency (RF) switches are important components of Radar transmit/receive (T/R) modules, satellite communication systems, Joint Tactical Radio Systems (JTRS), and the like. A promising RF switch technology uses Heterostructure Field Effect Transistors (HFETs). Recently, high power switches made of AlGaN/GaN HFETs demonstrated superior performance over other RF switching devices in terms of maximum power density, bandwidth, operating temperature, and breakdown voltage.

Many applications, including JTRS and low-noise receivers, require RF switches with a very low insertion loss, e.g., typically below 0.3 dB. A low loss switch dissipates little RF power. As a result, the switch can be fabricated over a low cost substrate, such as sapphire. Low insertion loss in an HFET is due to a high channel conductance of the device. Exceptionally high two dimensional electron gas densities at the AlGaN/GaN interface make a group III-Nitride HFET an ideal candidate for RF switching applications.

The feasibility of high-power broad-band monolithically integrated group III-Nitride HFET RF switches has been demonstrated. Large signal analysis and experimental data for a large periphery group III-Nitride switch indicate that the switch can achieve switching powers exceeding +40 to +50 dBm. To date, the performance of any FET-based RF switch is limited by a trade off between a reasonably low threshold voltage versus low OFF state capacitances, high switching powers, and high linearity.

SUMMARY OF THE INVENTION

Aspects of the invention provide a high-power, low-loss RF switch using a FET, such as a group III-Nitride based HFET or the like, which combines a low threshold voltage with a low OFF-state capacitance and an extremely high linearity and switching power. In an embodiment, the invention provides a field effect transistor having a channel, a gate, and a means for decreasing a gate-to-channel capacitance of the transistor as an operating frequency of the transistor increases. The means can comprise, for example, a barrier layer disposed between the gate and the channel, which has a dielectric permittivity and/or a conductivity that varies with an operating frequency of the transistor. In an embodiment, the barrier layer comprises a conducting material, such as conducting polymer, conducting semiconductor, conducting semi-metal, amorphous silicon, polycrystalline silicon, and/or the like.

A first aspect of the invention provides a field effect transistor comprising: a channel; a gate to the channel; and a barrier layer disposed between the gate and the channel, wherein the barrier layer comprises at least one of: a dielectric permittivity or a conductivity that varies with an operating frequency of the transistor.

A second aspect of the invention provides a field effect transistor comprising: a channel; a gate to the channel; and means for decreasing a gate-to-channel capacitance of the transistor as an operating frequency of the transistor increases.

A third aspect of the invention provides a field effect transistor comprising: a channel; a gate to the channel; and a barrier layer disposed between the gate and the channel, wherein the barrier layer comprises a conducting material selected from the group consisting of: conducting polymer, conducting semiconductor, conducting semi-metal, amorphous silicon, and polycrystalline silicon.

Other aspects of the invention provide circuits, apparatuses, and methods of designing, using and generating each, which include and/or utilize some or all of the field effect transistors described herein. The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide a field effect transistor having a channel, a gate, and a means for decreasing a gate-to-channel capacitance of the transistor as an operating frequency of the transistor increases. The means can comprise, for example, a barrier layer disposed between the gate and the channel, which has a dielectric permittivity and/or a conductivity that varies with an operating frequency of the transistor. In an embodiment, the barrier layer comprises a conducting material, such as conducting polymer, conducting semiconductor, conducting semi-metal, amorphous silicon, polycrystalline silicon, and/or the like. As used herein, unless otherwise noted, the term "set" means one or more (i.e., at least one) and the phrase "any solution" means any now known or later developed solution.

Figure 1A:
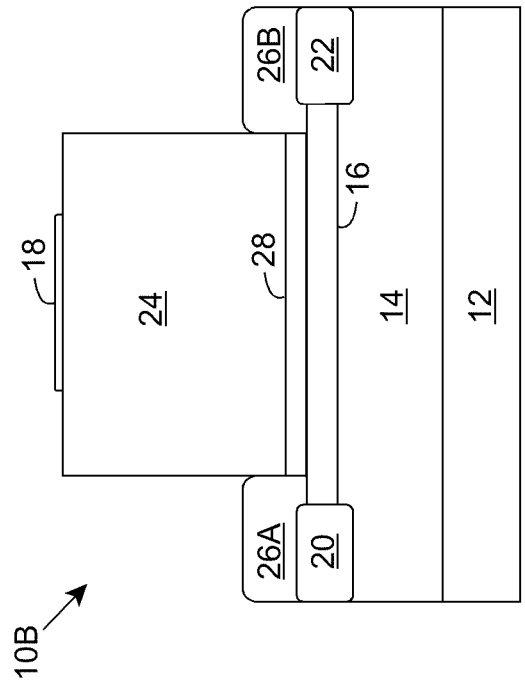
FIGS. 1A and 1B show illustrative devices according to embodiments.
Figure 1B:
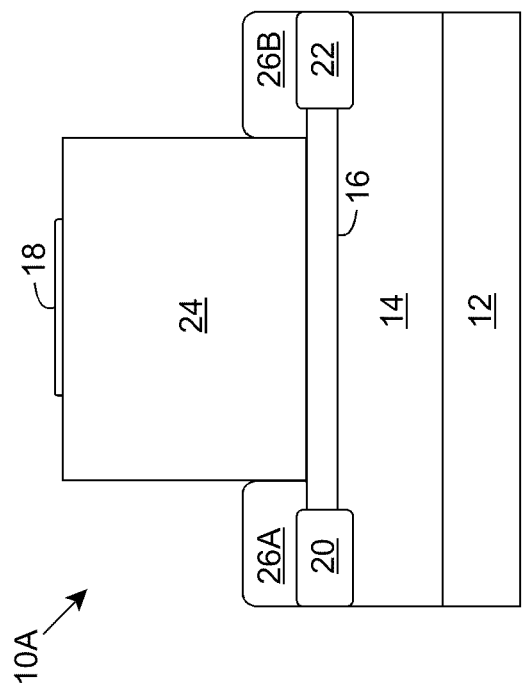

Turning to the drawings, FIGS. 1A and 1B show illustrative devices 10A and 10B according to embodiments. Each device 10A, 10B comprises a heterostructure field effect transistor (HFET), and includes a substrate 12, a first layer 14 adjacent to the substrate, and a second layer 16 immediately adjacent to the first layer 14. First layer 14 and second layer 16 form a device channel at their interface, which gate 18 can be utilized to control, and within which current can flow between source contact 20 and drain contact 22.

Devices 10A, 10B also include a barrier layer 24 disposed between second layer 16 and gate 18. As described herein, barrier layer 24 comprises a dielectric permittivity and/or a conductivity that varies with an operating frequency of devices 10A, 10B. For example, barrier layer 24 can comprise a capacitance that decreases with the operating frequency and/or a threshold voltage that increases with the operating frequency for the device 10A, 10B. Further, devices 10A, 10B also can include dielectric layers 26A, 26B located over a portion of second layer 16 and a corresponding contact 20, 22, respectively. Dielectric layers 26A, 26B can insulate the corresponding contacts 20, 22 from the barrier layer 24.

Devices 10A, 10B can be manufactured using any approach now known or later developed. Substrate 12 can comprise any type of substrate 12. Similarly, layers 14, 16 can comprise any type of materials capable of forming a channel. In an embodiment, devices 10A, 10B include one or more layers of materials selected from the group-III nitride material system (e.g., $Al_xIn_yGa_{1-x-y}N$, where $0 \leq X, Y \leq 1$, and $X+Y \leq 1$ and/or alloys thereof). For example, substrate 12 can comprise silicon carbide (SiC), first layer 14 can comprise gallium nitride (GaN), and second layer 16 can comprise aluminum gallium nitride (AlGaN). Gate 18 and contacts 20, 22 each can comprise any type of contact including, for example, a gold germanium contact, and dielectric layers 26A, 26B can comprise, for example, silicon dioxide.

As discussed herein, barrier layer 24 can comprise material having a dielectric permittivity and/or a conductivity that varies with an operating frequency of the device 10A, 10B. To this extent, barrier layer 24 can comprise conducting material having a low dielectric constant, e.g., conducting low-k material with a dielectric constant lower than that of silicon dioxide ($SiO_2$). For example, barrier layer 24 can comprise a conducting polymer, conducting semiconductor, conducting semi-metal, amorphous silicon, polycrystalline silicon, and/or the like.

As illustrated by device 10B, one or more layers, such as intermediate layer 28, can be located between barrier layer 24 and second layer 16. Intermediate layer 28 can comprise an insulating (dielectric) material having a high dielectric constant, e.g., a dielectric constant higher than that of $SiO_2$. For example, intermediate layer 28 can comprise a layer of Barium titanate ($BaTiO_3$), Strontium titanate ($SrTiO_3$), and/or the like. Regardless, devices 10A, 10B can comprise one or more conducting layers between gate 18 and second layer 16, which are formed using any appropriate conducting material. Inclusion of intermediate layer 28 can ensure negligible gate leakage current for device 10B.

The material for the layer(s) between gate 18 and second layer 16 in devices 10A, 10B can be selected such that the conductivity and dielectric permittivity of the layer(s) between gate 18 and second layer 16 provide a desired characteristic frequency of the threshold voltage and/or gate capacitance dispersion. However, it is understood that the materials described herein for devices 10A, 10B are only illustrative, and various other materials can be utilized as will be recognized by one of ordinary skill in the art. In an embodiment, the frequency dependence of the gate capacitance is achieved through the use of a material and/or multiple layers of materials having a frequency dispersion of the complex conductance of the barrier material(s) between the gate 18 and the transistor channel.

Further, it is understood that devices 10A, 10B can comprise additional layers and/or structures, which are not shown for clarity, but which may be included by a person of ordinary skill in the art based on a desired set of operating characteristics for the device 10A, 10B. To this extent, each device 10A, 10B can comprise any type of FET now known or later developed. For example, a device 10A, 10B can comprise a heterostructure FET (HFET), an inverted heterostructure FET, a junction FET, an insulated gate FET, a metal semiconductor FET, a doped channel metal-semiconductor FET, a metal oxide semiconductor FET, a metal insulator semiconductor FET, a doped channel metal-insulator-semiconductor FET, high electron mobility transistor, double heterostructure FET, etc.

Each device 10A, 10B can be configured to operate as a transistor switch in a radio frequency (RF) circuit. For example, a device 10A, 10B can be implemented as a switch in a circuit that is incorporated into any type of apparatus requiring such a switch, such as a high power, high frequency solid state apparatus. Illustrative apparatuses include radars, detectors, power amplifiers, rectifiers, wireless communication units, all types of power converters, and/or the like.

Figure 2A:
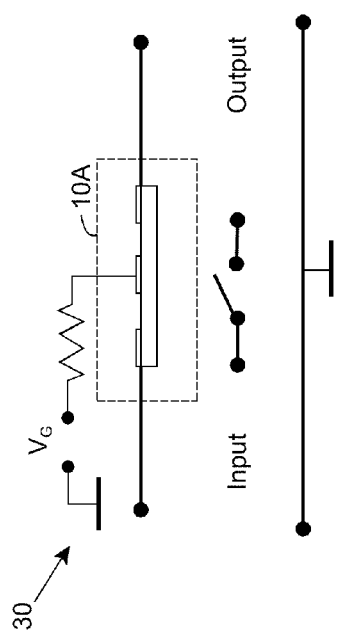
FIGS. 2A and 2B show an illustrative circuit and an illustrative low frequency effective gate position, respectively, according to embodiments.

To this extent, FIG. 2A shows an illustrative circuit 30 including a device 10 implemented as an RF switch according to an embodiment. In particular, circuit 30 is an RF transmission line that includes an RF input, an RF output, and a device, such as device 10A of FIG. 1A as an illustrative example, which operates as an RF switch between the RF input and the RF output. Referring to FIGS. 1A and 2A, device 10 is operated by applying a voltage, $V_G$, to the gate 18 of the device 10A. The inclusion of barrier layer 24 enables device 10A to achieve frequency dependent effective separation between gate 18 and the device channel when device 10A is operated as a switch within circuit 30. Such frequency dependence affects both the threshold voltage and the gate-to-channel capacitance.

Figure 2B:
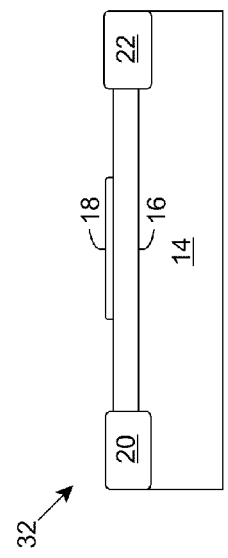

At direct current (DC) or low (e.g., switching) frequencies (e.g., frequencies below approximately 1 MHz), the barrier layer 24 is equivalent to a conductor. To this extent, as shown in FIG. 2B, gate 18 has an effective position that is directly on the second layer 16. In this case, the equivalent gate-channel separation is small and the threshold voltage is low. However, at high (e.g., microwave) frequencies (e.g., frequencies typically ranging from approximately 100 MHz to several tens or hundreds of GHz), the barrier layer 24 has a capacitive impedance. As a result, an effective position of the gate 18 is much higher than the second layer 16 (as shown in FIG. 1A), providing a gate-to-channel separation that is much larger as compared to that at DC or low frequencies. In this case, the device gate capacitance is low whereas an effective threshold voltage, and therefore the linearity and switching powers, are much higher.

A threshold voltage, $V_T$, for device 10A can be estimated as $qn_s/C_B$, where q is the charge of an electron, $n_s$ is the equilibrium sheet electron concentration in the channel, and $C_B$ is the capacitance of the barrier layer 24 material per unit area. For device 10A operating at DC or low frequencies, $C_B$ is given by the capacitance of layer 16 (e.g., a thin AlGaN layer) since barrier layer 24 is conducting, and can be estimated as $C_{B-DC} \approx \epsilon_A/d_A$, where $\epsilon_A$ and $d_A$ are the permittivity and the thickness of the bottom part of the barrier material (e.g., layer 16). For device 10A operating at high frequencies, the threshold voltage can be estimated as $C_{B-RF} \approx \epsilon_d/d_d$, where $\epsilon_d$ and $d_d$ are the permittivity and the thickness, respectively, of the top part of the barrier material (e.g., barrier layer 24). Since $d_d >> d_A$ and $\epsilon_d < \epsilon_A$ is also possible, $C_{B-RF} << C_{B-DC}$. As a result, the corresponding threshold voltage for device 10A operating at a high frequency is much higher than the corresponding threshold voltage for device 10A operating at a low frequency.

Figure 3A:
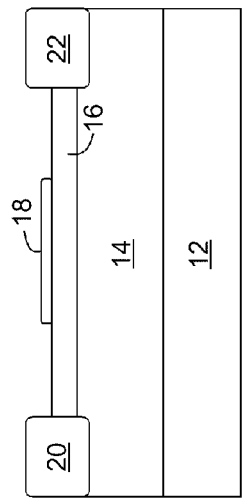
FIGS. 3A-3C show an illustrative prior art heterostructure field effect transistor, and equivalent ON state and OFF state circuits of an RF switch.
Figure 3C:
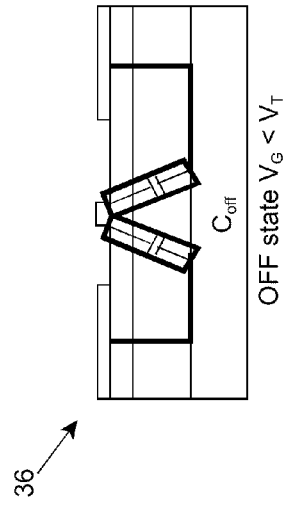
Figure 3B:
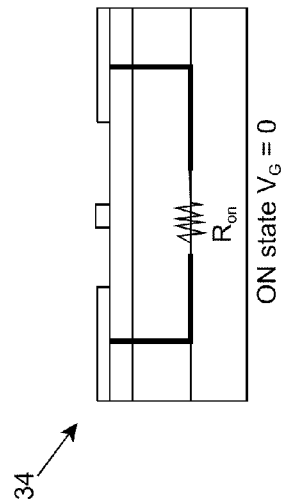

Illustrative properties of devices 10A, 10B are further described with reference to a typical prior art heterostructure field effect transistor (HFET) and implementation of devices 10A, 10B as an RF switch. To this extent, FIG. 3A shows a prior art HFET 2 and FIGS. 3B and 3C show equivalent ON state and OFF state circuits of a FET when operated as an RF switch. As illustrated, HFET 2 includes a substrate 12, a first layer 14, and a second layer 16, each of which can be formed similar to the corresponding layers of devices 10A, 10B (FIGS. 1A, 1B). Additionally, HFET 2 includes a gate 18 formed on second layer 16 and source contact 20 and drain contact 22 to the device channel formed between layers 14, 16.

FIG. 3B shows an equivalent ON state circuit 34 for a FET being operated as a RF switch. As illustrated, when the RF switch is in the ON state, e.g., $V_G=0$, the RF switch adds a resistance, $R_{on}$, between source contact 20 and drain contact 22 to the overall circuit. However, when the RF switch is in the OFF state, e.g., $V_G<V_T$, FIG. 3C shows the equivalent OFF state circuit 36, which shows the RF switch acting as a capacitor having a capacitance, $C_{off}$, between source contact 20 and drain contact 22 within the circuit.

Figure 4:
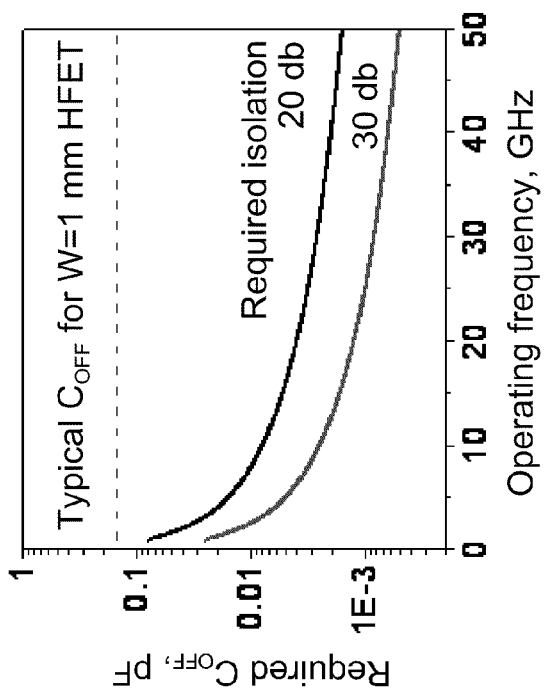
FIG. 4 shows a typical dependence of the required transistor OFF state capacitances to achieve twenty decibel (dB) and thirty dB isolation for various operating frequencies.

FIG. 4 shows a typical dependence of the required transistor OFF state capacitances, $C_{OFF}$, to achieve twenty decibel (dB) and thirty dB isolation for various operating frequencies. Additionally, a dashed line shows a typical OFF state capacitance of a one millimeter (mm) wide group III-N HFET 2 (FIG. 3A) with a one micrometer (μm) long gate. As illustrated, HFET 2 does not provide sufficient capacitance to obtain 20 or 30 db isolation at the various operating frequencies.

Figure 5:
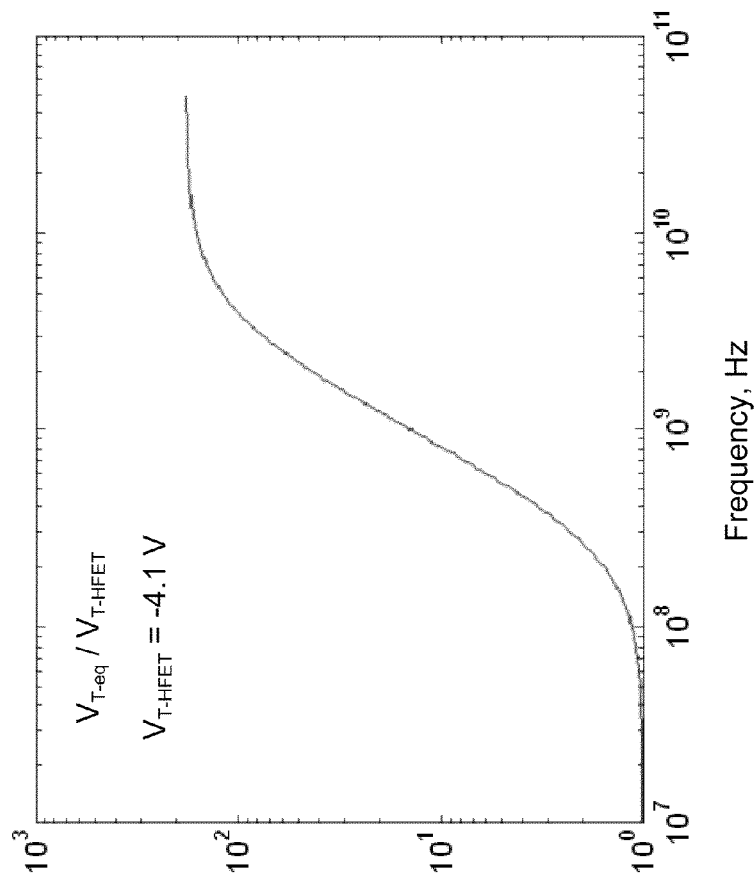
FIG. 5 shows simulated frequency dependence of the threshold voltage for an illustrative device of FIG. 1A according to an embodiment.

FIG. 5 shows simulated frequency dependence of the threshold voltage for an illustrative device 10A (FIG. 1A) according to an embodiment. In this case, device 10A has a device width, W=0.1 centimeters (cm) and a gate length, $L_G$=1e−4 cm, and an equilibrium channel sheet electron concentration, $ns_0$=1×10$^{13}$ cm$^{-2}$. Further, device 10A includes an AlGaN barrier layer 16 (FIG. 1A) having a thickness, $d_b$, of approximately 200e-8 cm and a relative permittivity, $\epsilon_b$=9. Barrier layer 24 (FIG. 1A) is formed of conducting material (e.g., conducting polymers, poly-silicon, low-doped semiconductor, etc.) having a thickness, $d_d$, of approximately 1e-4 cm, a relative dielectric permittivity, $\epsilon_d$=2, and a resistivity, $\rho$=50 Ω×cm. As illustrated, when operated as an RF switch, device 10A has a threshold voltage that significantly depends on the operating frequency. In particular, the threshold voltage of device 10A is relatively low in a frequency range from DC to a cut-off frequency (of approximately 100 MHz), and significantly increases at operating frequencies higher than the cut-off frequency. When compared to a prior art FET 2 (FIG. 3A), which has a voltage threshold, $V_{T-HFET}$, of −4.1 Volts, the voltage threshold of device 10A, $V_{T-eq}$, is substantially higher, e.g., up to approximately 200 times higher, at frequencies above the cut-off frequency.

Figure 6:
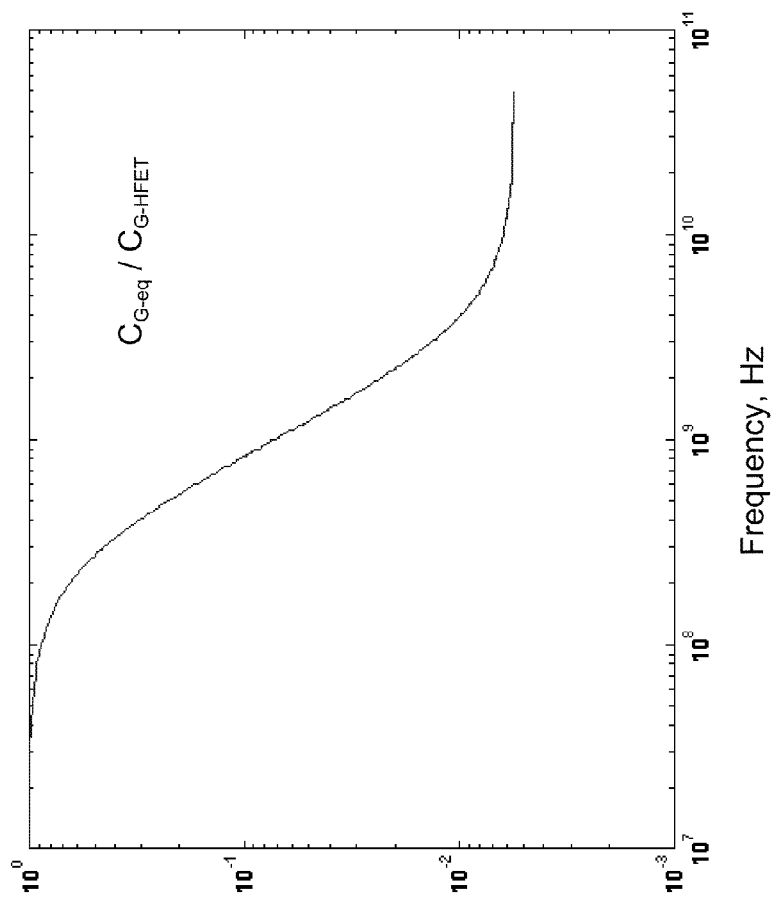
FIG. 6 shows the frequency dependence of the equivalent gate-channel capacitance for an illustrative device of FIG. 1A according to an embodiment.

FIG. 6 shows the frequency dependence of the equivalent gate-channel capacitance for an illustrative device 10A (FIG. 1A) according to an embodiment. In this case, device 10A has the same parameters as the device described in conjunction with FIG. 5. As illustrated, when operated as an RF switch, device 10A has an OFF state capacitance that significantly depends on the operating frequency. In particular, the OFF state capacitance of device 10A is relatively high in a frequency range from DC to a cut-off frequency (e.g., approximately 100 MHz), and significantly decreases at operating frequencies higher than the cut-off frequency. When compared to a prior art FET 2 (FIG. 3A), which has an OFF state capacitance, $C_{G-HFET}$, the OFF state capacitance of device 10A, $C_{G-eq}$, is substantially smaller at frequencies above the cut-off frequency, and particularly at frequencies above 1 GHz.

Figure 7:
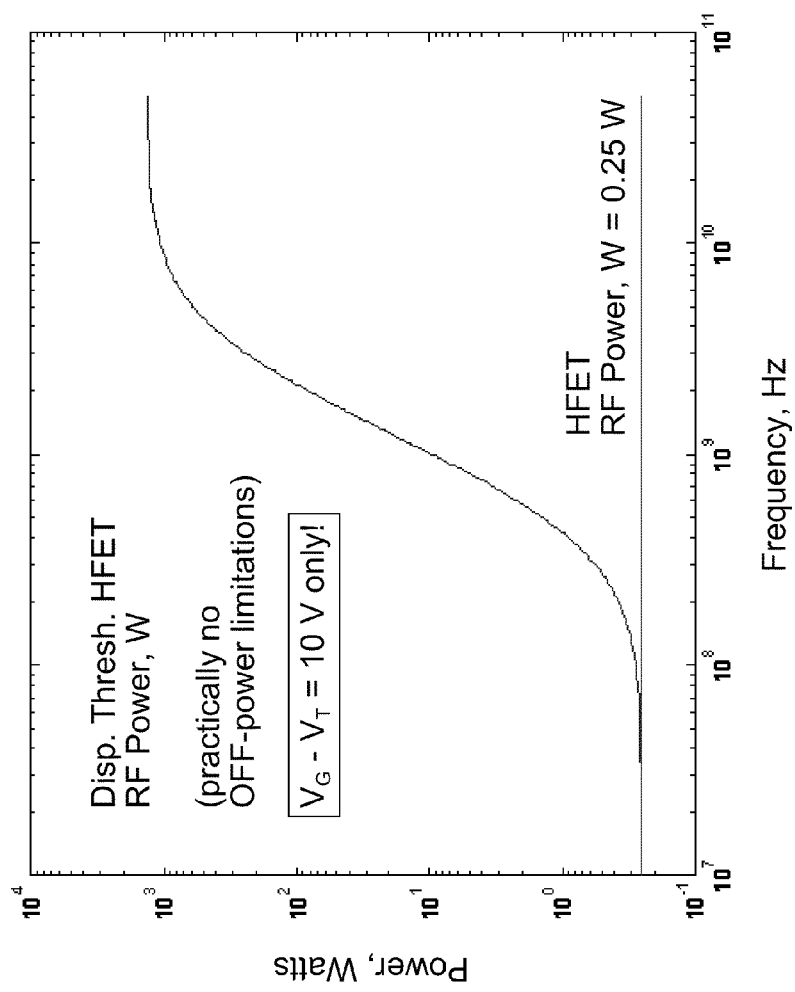
FIG. 7 shows the frequency dependence of a maximum switching RF power for an illustrative device of FIG. 1A according to an embodiment.

FIG. 7 shows the frequency dependence of a maximum switching RF power for an illustrative device 10A (FIG. 1A) according to an embodiment. In this case, device 10A has the same parameters as the device described in conjunction with FIG. 5. For comparison, the maximum switching power of a regular HFET 2 (FIG. 3A) with identical gate bias, barrier layer 16 (FIG. 1A) thickness, gate length, and width is shown. As illustrated, when operated as an RF switch, device 10A has a maximum switching power that significantly depends on the operating frequency. In particular, the maximum switching RF power of device 10A is relatively low in a frequency range from DC to a cut-off frequency (e.g., approximately 100 MHz), and significantly increases at operating higher than the cut-off frequency. At frequencies above the cut-off frequency, and particularly above 1 GHz, the maximum switching power of device 10A well exceeds the maximum switching power of the corresponding regular HFET 2, $P_{HFET}$, which is approximately 0.25 Watts.

Figure 8:
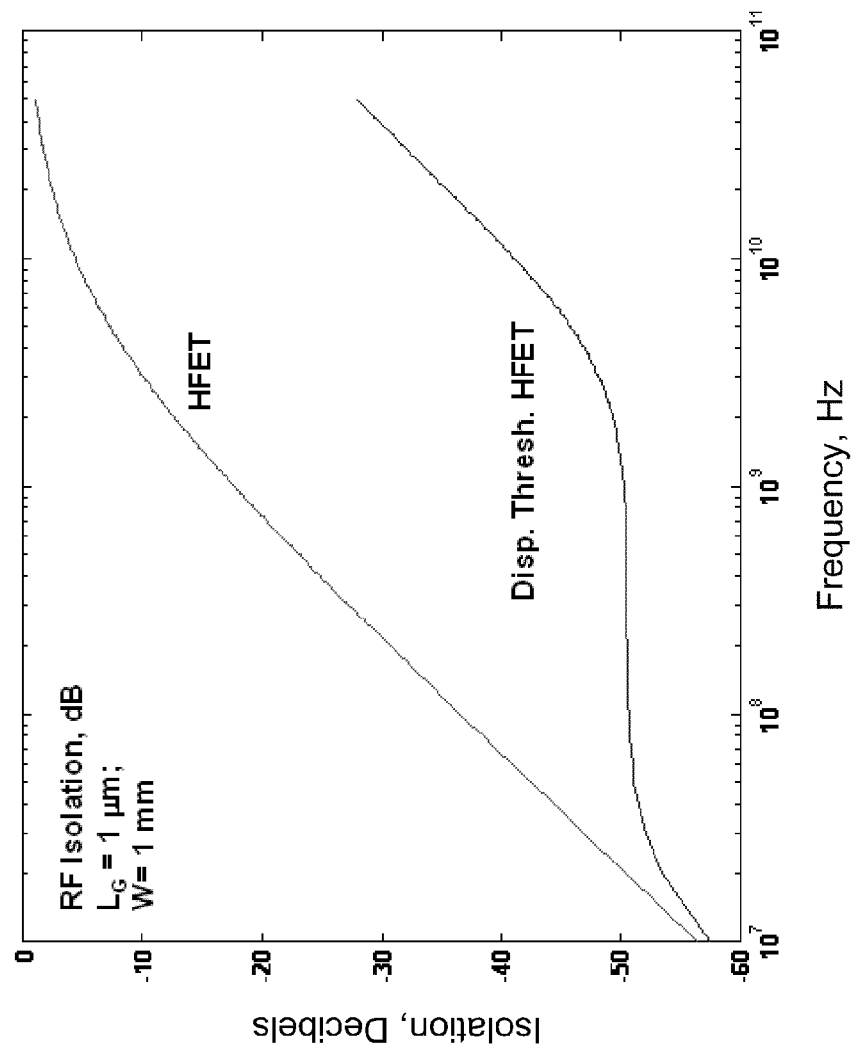
FIG. 8 shows the frequency dependence of RF isolation in the OFF state for an illustrative device of FIG. 1A according to an embodiment.

FIG. 8 shows the frequency dependence of RF isolation in the OFF state for an illustrative device 10A (FIG. 1A) according to an embodiment. In this case, device 10A has the same parameters as the device described in conjunction with FIG. 5. For comparison, the isolation of a regular HFET 2 (FIG. 3A) with identical gate bias, barrier layer 16 (FIG. 1) thickness, gate length, and width is shown. As illustrated, when operated as an RF switch, device 10A has an OFF state isolation that is extremely low (e.g., below −50 decibels) in a frequency range from DC to a cut-off frequency (e.g., approximately one GHz), and increases at operating frequencies higher than the cut-off frequency. However, for all frequencies, the OFF state isolation for device 10A remains substantially below the OFF state isolation of HFET 2.

As illustrated by FIGS. 5-8, device 10A, 10B (FIG. 1A, 1B) can concurrently provide a low threshold voltage for DC/low frequency operation, a low OFF state capacitance, and extremely high RF signal linearity and switching powers during high frequency operation. This combination of operating parameters can provide the best performance for any transistor-based switching device, circuit, etc. As described herein, the combination can be achieved through a frequency-dependent threshold voltage, which results from frequency-dependent dielectric permittivity and/or conductivity of the material between the gate 18 (FIG. 1A, 1B) and the channel of device 10A, 10B.

While shown and described herein as a transistor configured for improved RF switch performance, it is understood that aspects of the invention further provide various alternative embodiments. For example, in one embodiment, the invention provides a method of manufacturing such a transistor. The transistor can be manufactured using any solution. For example, referring to FIGS. 1A and 1B, devices 10A, 10B can be manufactured by initially obtaining a heterostructure including substrate 12, first layer 14, and second layer 16. In an embodiment, the heterostructure is formed by obtaining a substrate 12, forming the first layer 14 on the substrate 12, and forming the second layer 16 on the first layer 14. Regardless, barrier layer 24 and/or intermediate layer 28 can be formed on the second layer 16 using any solution. For example, each layer 24, 28 can be formed on a previous layer. Additionally, the source contact 20 and drain contact 22 can be formed. In an embodiment, source contact 20 and drain contact 22 are formed by selectively etching (e.g., applying a mask, etching, removing the mask, and/or the like) barrier layer 24, intermediate layer 28, and/or second layer 16, and forming source contact 20 and drain contact 22 in the etched regions. Further, gate 18 can be formed on barrier layer 24 using any solution. As used herein, it is understood that "form" includes any combination of various processes, which can be utilized to form a layer of material, including, but not limited to depositing material(s), growing material(s), etching material(s), and/or the like.

In another embodiment, the invention provides a field effect transistor-based switch in which at least one field effect transistor of the switch is configured as described herein. In still another embodiment, the invention provides a circuit that includes a field effect transistor-based switch in which at least one field effect transistor of the switch is configured as described herein. Still further embodiments provide an apparatus, such as a radar, a detector, a power amplifier, a rectifier, a wireless communication unit, a power converter, and/or the like, which includes at least one field effect transistor as described herein.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual having ordinary skill in the art are included within the scope of the invention as defined by the accompanying claims.

What is claimed is:

1. A field effect transistor comprising:
a channel;
a gate to the channel; and
a barrier located between the gate and the channel, wherein the barrier is configured to decrease a gate-to-channel capacitance of the transistor as an operating frequency of the transistor increases such that a corresponding threshold voltage of the transistor increases as the operating frequency of the transistor increases, and wherein the barrier includes:
 a first barrier layer formed of a nitride material having a first resistance and a first capacitance, wherein the first barrier layer is located directly on the channel; and
 a second barrier layer comprising a layer of non-dielectric conducting material, the second barrier layer having a second resistance and a second capacitance, wherein the second barrier layer is located on the first barrier layer and the gate is located directly on the second barrier layer,
wherein, at an operating frequency above a minimal operating frequency, the first resistance is at least ten times larger than the second resistance,
wherein, at an operating frequency above the minimal operating frequency, the first capacitance is at least two times larger than the second capacitance, and
wherein a product of the second resistance and the second capacitance is larger than an inverse of an operating frequency of the transistor above the minimal operating frequency.

2. The transistor of claim 1, wherein the conducting material is selected from the group consisting of: conducting polymer, conducting semiconductor, conducting semi-metal, amorphous silicon, and polycrystalline silicon.

3. The transistor of claim 1, further comprising a first layer immediately adjacent to the first barrier layer, wherein the channel is formed at an interface of the first layer and the first barrier layer.

4. The transistor of claim 3, wherein the first layer comprises gallium nitride and the first barrier layer comprises aluminum gallium nitride.

5. The transistor of claim 1, further comprising a layer of an insulating material located between the first barrier layer and the second barrier layer.

6. The transistor of claim 5, wherein the layer of insulating material comprises material selected from the group consisting of: Barium titanate and Strontium titanate.

7. A field effect transistor comprising:
a channel;
a gate to the channel; and
means for decreasing a gate-to-channel capacitance of the transistor as an operating frequency of the transistor increases such that a corresponding threshold voltage of the transistor increases as the operating frequency of the transistor increases, and wherein the threshold voltage at an operating frequency greater than a transition range of frequencies is at least two times higher than a threshold voltage of the transistor at an operating frequency below the transition range of frequencies, wherein the means for decreasing includes:
 a nitride-based barrier layer located directly on the channel; and
 a layer of conducting material located directly on the barrier layer, wherein the gate is located directly on the layer of conducting material.

8. The transistor of claim 7, wherein the layer of conducting material is selected from the group consisting of: conducting polymer, conducting semiconductor, conducting semi-metal, amorphous silicon, and polycrystalline silicon, wherein the layer of conducting material has a first resistance and a first capacitance; and
wherein the barrier layer has a second resistance and a second capacitance,
wherein, at an operating frequency above a minimal operating frequency, the first resistance is at least ten times larger than the second resistance,
wherein, at an operating frequency above the minimal operating frequency, the first capacitance is at least two times larger than the second capacitance, and
wherein a product of the second resistance and the second capacitance is larger than an inverse of an operating frequency of the transistor above the minimal operating frequency.

9. The transistor of claim 8, further comprising a first layer immediately adjacent to the barrier layer, wherein the channel is formed at an interface of the first layer and the barrier layer.

10. A field effect transistor comprising:
- a channel;
- a gate to the channel; and
- a barrier located between the gate and the channel, wherein the barrier comprises:
  - a layer of non-dielectric conducting material selected from the group consisting of: conducting polymer, conducting semiconductor, conducting semi-metal, amorphous silicon, and polycrystalline silicon, wherein the layer of conducting material has a first resistance and a first capacitance; and
  - a barrier layer formed of a nitride material disposed between the channel and the layer of conducting material, wherein the barrier layer has a second resistance and a second capacitance,
- wherein the barrier layer is located directly on the channel, the layer of non-dielectric conducting material is located directly on the barrier layer, and the gate is located directly on the layer of non-dielectric conducting material,
- wherein, at an operating frequency above a minimal operating frequency, the first resistance is at least ten times larger than the second resistance,
- wherein, at an operating frequency above a minimal operating frequency, the first capacitance is at least two times larger than the second capacitance, and
- wherein a product of the second resistance and the second capacitance is larger than an inverse of an operating frequency of the transistor above the minimal operating frequency.

11. The transistor of claim 10, further comprising a first layer comprising gallium nitride immediately adjacent to the barrier layer, wherein the barrier layer comprises aluminum gallium nitride, and wherein the channel is formed at an interface of the first layer and the barrier layer.

12. The transistor of claim 1, wherein the minimal operating frequency is within a transition range of frequencies, wherein a threshold voltage of the transistor at an operating frequency greater than the transition range of frequencies is at least two times higher than a threshold voltage of the transistor at an operating frequency below the transition range of frequencies, and wherein the transition range of frequencies is between approximately ten megahertz and approximately one gigahertz.

13. The transistor of claim 1, wherein the minimal operating frequency is within a transition range of frequencies, wherein a threshold voltage of the transistor at an operating frequency greater than the transition range of frequencies is at least two times higher than a threshold voltage of the transistor at an operating frequency below the transition range of frequencies, and wherein at least one of: a thickness, a resistivity, or a permittivity of the second barrier layer is selected based on a desired operating frequency.

14. The transistor of claim 1, wherein the minimal operating frequency is within a transition range of frequencies, wherein a threshold voltage of the transistor at an operating frequency greater than the transition range of frequencies is at least ten times higher than a threshold voltage of the transistor at an operating frequency below the transition range of frequencies.

15. The transistor of claim 1, wherein the minimal operating frequency is within a transition range of frequencies, wherein a threshold voltage of the transistor at an operating frequency greater than the transition range of frequencies is at least one hundred times higher than a threshold voltage of the transistor at an operating frequency below the transition range of frequencies.

16. The transistor of claim 7, wherein a threshold voltage of the transistor at an operating frequency greater than the transition range of frequencies is at least one hundred times higher than a threshold voltage of the transistor at an operating frequency below the transition range of frequencies.

17. The transistor of claim 1, wherein the second barrier layer is directly on the first barrier layer.

18. The transistor of claim 1, wherein the barrier is formed using a method including selecting the nitride material and the layer of non-dielectric conducting material based on a threshold voltage of the transistor.

19. The transistor of claim 1, wherein the barrier is formed using a method including selecting the nitride material and the layer of non-dielectric conducting material based on a desired gate capacitance dispersion of the transistor.

* * * * *